United States Patent [19]
Fujimoto et al.

[11] Patent Number: 4,462,047
[45] Date of Patent: Jul. 24, 1984

[54] SOLID STATE IMAGER WITH BLOOMING SUPPRESSION

[75] Inventors: Makoto Fujimoto, Takatsuki; Yoshio Ohta, Amagasaki; Takao Chikamura, Kyoto, all of Japan

[73] Assignee: Matsushita Electric Industrial Co., Ltd., Osaka, Japan

[21] Appl. No.: 394,168

[22] Filed: Jul. 1, 1982

[30] Foreign Application Priority Data

Jul. 1, 1981 [JP] Japan ................... 56-102784

[51] Int. Cl.³ .................. H04N 3/12; H04N 3/14
[52] U.S. Cl. .................. 358/212; 358/213; 357/24
[58] Field of Search ............ 358/212, 213; 357/24 LR; 250/211 J, 578

[56] References Cited
U.S. PATENT DOCUMENTS 4,271,420 6/1981 Chikamura et al. ........... 357/24 LR

FOREIGN PATENT DOCUMENTS

| 72585 | 6/1981 | Japan | 358/213 |
| 72583 | 6/1981 | Japan | 358/213 |
| 72582 | 6/1981 | Japan | 358/213 |
| 102170 | 8/1981 | Japan | 358/213 |

Primary Examiner—John C. Martin
Assistant Examiner—Luan Nguyen
Attorney, Agent, or Firm—Wenderoth, Lind & Ponack

[57] ABSTRACT

A solid state imaging apparatus having a plurality of cells for accumulating charge signals in response to an incident light and charge transfer means connected to the cells through a switching element.

A read pulse and a transfer pulse are applied to the switching element and the transfer means, respectively, to read the charge signals from the cells and transfer those signals, so that a video signal is produced.

Blooming suppression pulse synchronous with the transfer pulse is supplied to a node between the cell and the switching element through a capacitive coupling.

2 Claims, 7 Drawing Figures

SOLID STATE IMAGER WITH BLOOMING SUPPRESSION

BACKGROUND OF THE INVENTION

This invention relates to a driving technique for solid state imaging apparatus.

One of conventional solid state imaging apparatus is a combination of an optical sensor including a matrix array of photodiodes and an XY scanner implemented with field effect transistors.

The recent development in this field offers BBDs and CCDs (collectively referred to as "charge transfer type" hereinafter) which are almost free of spike-like noise originating from scanning pulses as experienced in the XY matrix cell structure. Both of the above mentioned types of imaging apparatus, however, require that the photodiodes in the optical sensor section be disposed in the same surface of a substrate as that where the field effect transistors for XY scanning or an electrode structure for charge transfer are formed, thus resulting that the efficiency of light utilization per unit area is one third through one fifth at the very best.

Several approaches to circumvent the above problem have been proposed—a solid state imager including in combination photoconductors instead of the photodiodes in the optical sensor portion and the XY matrix field effect transistors and a solid state imager including such photoconductors and the charge transfer electrode assembly. In any case, electrodes overlying the photoconductors are held at a DC potential.

An example of solid state imagers using the photoconductor coating is now discussed in greater detail.

Referring to FIG. 1, there is typically illustrated in cross section a unit of circuit elements of the charge transfer type disposed a silicon substrate. An $n^+$ type region is buried in the p type semiconductor substrate 10 to set up diodes. A $p^+$ type region 12 serves as a potential barrier for preventing injection of electrons from the $n^+$ type region 11 in the case of CCD operation mode. An $n^+$ type region 13 serves as a potential well in the case of BBD operation mode. Only either of these last two regions is required, depending upon a selected one of the two operation modes, CCD and BBD. Since both the CCD and BBD operation modes make use of charge transfer similarly, only the BBD mode using the $n^+$ type region 13 is discussed in the following section.

A first gate electrode 14 has an overlap with the $n^+$ region 11. A layer of insulator lying between the semiconductor substrate 10 and the first gate electrode 14 is a gate oxide film. An insulating layer 16 establishes electrical isolation between a first electrode 17 and the semiconductor substrate 10 and the first gate electrode 14. The first electrode 17 behaves as not only an electrode for a diode electrically connected to the $n^+$ type region 11 but also one for a hole-stopping layer 18. A layer of photoconductor 19 is made of a composition $(Zn_{1-x}Cd_xTe)_{1-y}(In_2Te_3)_y$ with transparent electrode 20 overlying thereon. The transparent electrode is supplied with a positive DC potential $V_D$ from a voltage source 21. The potential supplied should not be constantly positive and in some cases may be negative, based upon the characteristics of the photoconductor layer.

The following description sets forth the reading of optical information on the conventional solid state imager structure as illustrated in FIG. 1.

FIG. 2 depicts the waveform of pulses for enabling the cell structure and variations in the potential at the first electrode 17.

If a pixel read pulse of a voltage $V_{CH}$ is applied to the first gate electrode 14 at instance $t_1$, then the electrode 17 is charged to a potential $V_{CR}$ as seen in FIG. 2b, wherein $V_{CR}$ is the potential represented as follows:

$$V_{CR} = V_R + \frac{C_B}{C_B + C_j} V_{CH} - V_{TR}$$

The reason why the potential $V_{CR}$ is defined as above will be discussed hereinafter.

$V_R$ is the reference voltage by which the cell structure is enabled in BBD mode upon application of a transfer pulse of a voltage $V_\phi$ to the first gate electrode and may be represented as follows:

$$V_R = V_\phi - V_{TB}$$

$V_{TB}$ is the threshold voltage of an MOS transistor or a constitutional element of the BBD structure.

It should be noticed that those BBD elements are aligned in the direction T of transferring signal charges as shown in the drawings.

$V'_{TR}$ is the threshold voltage of the MOS transistor including a bias voltage to the substrate, the MOS transistor being built up by including the $n^+$ type regions 11 and 13 and the first gate electrode 14.

Assuming that there is incident light 22 on the cell structure, it generates electron-hole pairs in the photoconductor layer 19 and the resulting holes proceed to the electrodes 17 and 20, reducing the potential at the electrode 17. The potential drops in proportion to the quantity of the incident light and especially drops gradually down to $V_S$ during a fram interval. Should $V_{CH}$ be applied again to the first gate electrode 14 at instance $t_2$, the surface potential beneath that electrode increases so that transfer of electrons takes place from the $n^+$ region 11 to the $n^+$ region 13. The potential at the $n^+$ region 11 consequently rises again and reaches $V_{CR}$. A total of charges transferred to the $n^+$ region 13 is dependent upon the intensity of the incident light.

Whereas the foregoing has set forth the structure of the solid state imaging unit comprising comprised of the optical sensing element and the first gate electrode 14, a mechanism by which electric signals converted from optical ones and read in the $n^+$ region 13 are transported to an output stage by means of self-scanning will now be explained in detail.

FIG. 3 is a plan view illustrating in a single-dimensional manner the solid state imaging unit, wherein 23 shows the imaging unit as denoted by the dog line and the remaining numbers show components similar to those in FIG. 1. There are additionally provided second gate electrodes 24 and 26 between the first gate electrodes 14 and 25 in the adjoining imaging elements. Through the above mentioned procedure charges read in the first gate electrodes 14 moves below the second gate electrode 24 in the form of charge transfer upon the positive transfer pulse as in FIG. 1 applied to the second gate electrode 24. The charges below the second gate electrode 24 are sequentially transferred to the first gate electrode 25 and then second gate electrode 26 under the same operating principle and eventually to the output stage. In other words, it is possible to transfer the electric signals converted from the optical ones to the output stage using two-phase clock signals.

The DC bias voltage exerted on the second electrodes offers significant advantages as follows: One of those advantages is prevention of blooming. The blooming is the phenomenon in which light-generated carriers extend horizontally and the light-generated signals go beyond the range of the incident light in particular when the incident light is highly intensive. This developes a white line along the direction of transfer from a functional point of view in the case of the charge transfer type of solid state imagers. As is best shown in FIG. 2, the potential $V_{CR}$ at the diode which is held at $V_{CR}$ with the read pulse would decrease to $V_S$ during a frame interval because of light radiation. If the incident light is too intensive, then the diode potential would fall below $V_R$ as shown by the dot-and-dash line in FIG. 2b so that a channel below the first gate electrode may become conductive even when the transfer pulse is applied. As a result of this, current runs from the n+ region 13 to the n+ region 14 and pixels in the direction of transfer look like providing optical signals and cause fluctuations in the potential, developing a white line. However, provided that the electrode 20 overlying the photoconductor in FIG. 1 is supplied with a positive bias voltage $V_D$ 21, the diode potential never falls below $V_D$ even with the incident light. $V_D$ selected above $V_R$ allows no reading procedure responsive to the transfer pulse and alleviates the blurring phenomenon.

The approach to alleviate the blooming, however, presents outstanding problems as follows.

The above approach is not successful in suppressing the blooming and rather results in a decrease in signal components and in other words in the dynamic range.

$V_{sat}$ in FIG. 2 represents a voltage component corresponding to the amplitude of a signal when intervals light is incident.

This value $V_{sat}$ is considered as one which becomes saturated because of the intensive incident light and can be written as follows:

$$V_{sat} = V_{CR} - V_C$$

As stated previously, the diode potential is selected such that it never falls below $V_R$ when intensive light impinges thereon during the period of light accumulation and therefore is correlated as $V_D > V_R$.

According as the diode potential $V_D$ decreases, carriers (electrons in this case) activated by an optical signal corresponding to this potential penetrate into a diode disposed near the diode in issue and a transfer channel depletion layer via the substrate, thus resulting in the blooming phenomenon.

It is impossible to keep completely non-conductive the channel below the first gate electrode when the transfer pulse is applied, even though the DC source $V_D$ is connected to hold the diode potential substantially at $V_D$.

This is because the signal carriers accumulated in the diode diffuse partly into the depletion layer due to a potential gradient as established by a potential at the adjoining diode or the transfer channel depletion layer.

The greater the quantity of the signal carriers which diffuse into the surrounding regions and result in the occurrence of the blooming (this is referred to as "excess carriers" hereinafter), the lower the diode potential $V_D$ or the stronger the incident light.

This implies as follows: Any attempt to suppress the quantity of the excess carriers demands an increase in the voltage value of the DC source (substantially equal to the diode potential). However, this approach entails a drop in the signal component $V_{sat}$ or the amplitude of the saturated signal, thus limiting the dynamic range.

Furthermore, with $V_D$ increased, burning takes place on the photoconductor layer as proved by the results of experiments.

SUMMARY OF THE INVENTION

Accordingly, it is an object of the present invention to provide a solid state imaging apparatus in which the blooming is effectively suppressed without limiting the dynamic range or causing the burning phenomenon.

A solid state imaging apparatus according to the present invention includes a plurality of cells for accumulating charge signals in response to an intensity of an incident light and charge transfer means for transferring the charge signal from the cells. Each of the cells is connected to the charge transfer means through a switching element.

The charge signals accumulated in the cells are read out to the charge transfer means by applying a read pulse to the switching element. Thus obtained charge signals are transferred by the charge transfer means which is driven by a transfer pulse, thereby producing a video signal at the output stage.

Blooming suppression means is provided for supplying a blooming suppression pulse synchronous with the transfer pulse to a node between the cell and the switching element through a capacitive coupling.

DETAILED DESCRIPTION OF THE INVENTION

Figure 1:
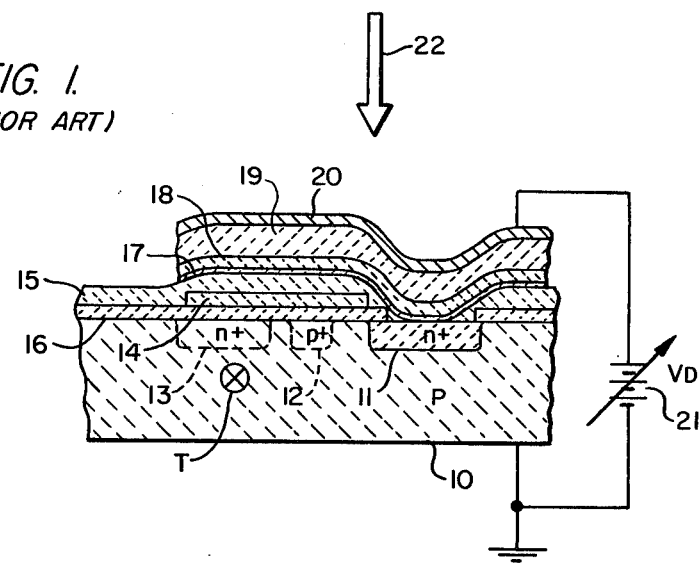
FIG. 1 is a cross sectional view of a principal portion of a conventional solid state imaging apparatus.
Figure 2:
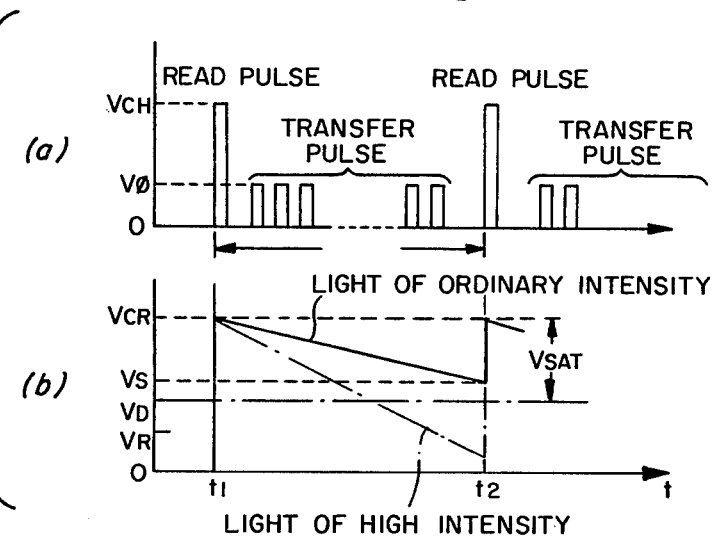
FIG. 2 is a waveform chart for explanation of operation of the conventional solid state imaging apparatus.
Figure 3:
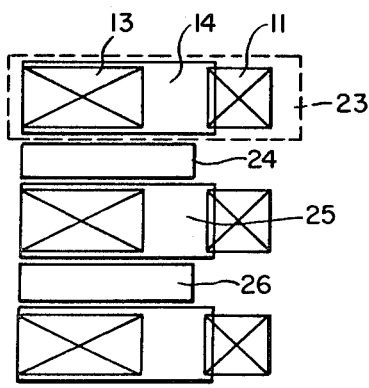
FIG. 3 is a plan view of the principal portion of the imaging apparatus.

The present invention is applicable to each of units of a solid state imager which is analogous to that as in FIG. 1, for example.

Figure 4:
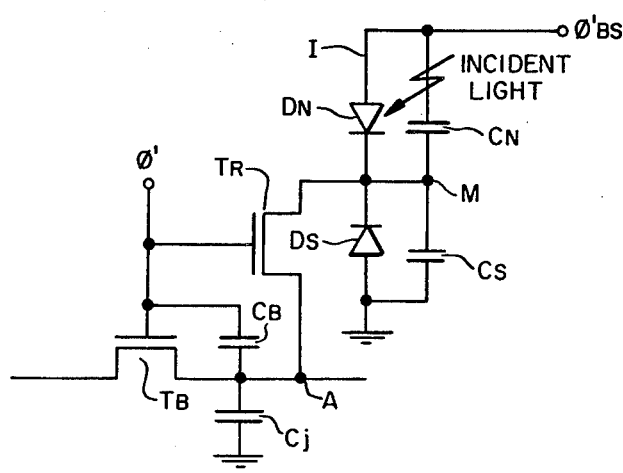
FIG. 4 is an equivalent circuit diagram of a solid state imaging apparatus according an embodiment of the present invention.

An equivalent circuit of the imaging unit for use with the present invention is illustrated in FIG. 4, which circuit includes a terminal $\phi'$ through which the pixel read pulse $V_{CH}$ or the transfer pulse $V_\phi$ is applied to a first gate electrode (14 in FIG. 1) of a transistor $T_B$, a bucket capacitor $C_B$ useful when BBD mode is in operation, a junction capacitor $C_j$, a photoconductor $D_N$ and a diode $D_S$ forming the source of a transistor $T_R$, with $D_N$ and $D_S$ being electrically connected together at node M (i.e. 17 in FIG. 1).

$C_N$ and $C_S$ equivalently illustrate the capacitances of the photoconductor $D_N$ and diode $D_S$.

A terminal $\phi'_{BS}$ is provided through which an electric signal is applied to an electrode opposing the transparent electrode 20 in FIG. 1, that is, an electrode I in electrical contact with the photoconductor $D_N$.

In the conventional cell design, the blooming is curbed to some extent by applying the DC voltage to the terminal $\phi_{BS}$.

The present invention, on the other hand, is excellent and successful in suppressing the blooming by applying a pulsatory signal to the terminal $\phi'_{BS}$.

The imaging unit operates in the following manner when the pulsatory signal is applied to the electrode terminal $\phi'_{BS}$.

FIG. 5(a) is a waveform diagram of clock pulses including the pixel read pulses for reading pixel signals applied to the terminal $\phi'$ and clock pulses for transfer of signal charges. It should be noticed that the pixel read pulses and the transfer pulses have the voltage values $V_{CH}$ and $V_{\phi'}$ respectively.

FIG. 5(b) depicts pulses applied to the electrode terminal $\phi'_{BS}$ having a high level $V_C$ and a low level $V_L$.

FIG. 5(c) depicts variations in the potential at node M or the diode potential (see FIG. 4) when the clock pulses $\phi$ and the blooming suppression pulses $\phi_{BS}$ are supplied to the terminals $\phi'$ and $\phi'_{BS}$ (see FIG. 4), respectively, with its abscissa plotted with time t as defined by time slots $T_0$–$T_3$.

FIG. 5(c) is further discussed with reference to the equivalent circuit diagram of FIG. 4. The following description will not set forth time constant-related transitional response is not since it is negligible.

(I) Time slot $T_0$

Even though the diode potential (see FIG. 4) at node M intends to decrease when intensive light is incident, the low level $V_L$ of the blooming suppression pulses $\phi_{BS}$ serves to clamp the diode potential at node M at a predetermined level $V_L$ (the forward voltage drop $V_F$ of the photoconductor $D_N$ is omitted for the sake of convenience only) via the electrode terminal $\phi'_{BS}$.

The diode potential at node M never falls below $V_L$ so that the blooming may be suppressed without the excess carriers penetrating through the substrate prior to discharge by way of the terminal $\phi'_{BS}$.

The effect of suppressing the blooming increases with an increase in the potential $V_L$. As noted earlier, this potential shall not be high because it would otherwise lower the bias voltage to the photoconductor layer to deteriorate the dynamic range or cause the burning phenomenon.

(II) Time slot $T_1$

The read pulse $V_{CH}$ is applied to the terminal $\phi'$ during this period. As a result, there is supplied at node A of the transfer channel $T_B$ a potential which is a division of the potential $V_{CH}$ as a determined by the capacitors $C_B$ and $C_j$ and superimposed on a previous potential $V_R$ ($=V_\phi - V_{TB}$ where $V_{TB}$ is the threshold voltage of the transfer channel $T_B$) at node A.

The instantaneous potential $V_h$ at node A when such superimposition takes place is:

$$V_h = V_R + \frac{C_B}{C_B + C_j} V_{CH} \quad (1)$$

As soon as the potential is added at the transfer channel in this manner, the gate of pixel read transistor $T_R$ becomes conductive and charging current flows from node A to node M.

Therefore, the potential $V_2$ at node M rises to the cut-off point of the transistor $T_R$.

In other words, $$V_2 = V_{CH} - V_{TC} - \Delta K_{SB} \quad (2)$$

where $V_{TC}$ is the threshold voltage of the pixel read transistor $T_R$ $\Delta K_{SB}$ is an increased in the threshold voltage due to the bias effect to the substrate.

It is further required that $V_h$ be sufficiently higher than $V_2$ in order to ensure the mode of operation described above.

In other words, $$V_\phi = V_{TB} + \frac{C_B}{C_B + C_j} V_{CH} >> V_{CH} - V_{TC} - \Delta K_{SB}$$

If $V_{TB} \simeq V_{TC} + \Delta K_{SB}$, then the following requirement would be satisfied:

$$V_\phi >> \frac{C_j}{C_B + C_j} V_{CH} \quad (3)$$

(III) Time slot $T_2$

The diode potential at node M drops as a function of the quantity of the incident light during this period. Such a potential drop is read into the transfer channel $T_B$ as a video signal. Even if the incident light is more than several tens times as intense as the quantity of saturation light, the diode potential at node M is clamped at the potential $V_L$ for the above reason.

At this moment the potential at $\phi'$ is zero.

The potential at node M which renders the transistor $T_R$ conductive is $-V_{TC} - \Delta K_{SB}$ where $V_{TC}$ is the threshold voltage of $T_R$ and $\Delta K_{SB}$ is the increase in the threshold voltage due to the bias effect to the substrate. The potential at node M shall be positive since signal charges accumulated in the diode $D_S$ may be diffused into the substrate to cause the blooming when the potential at node M is negative. As is clear from the foregoing, the $V_L$ potential is sufficient and effective to suppress the blooming as long as it has a positive low level.

(IV) Time slot $T_3$

The diode potential at node M during the time slot $T_2$ is the value $V_2'$ which is equal to the value $V_2$ as calculated above minus the potential decrease $\Delta V_S$ resulting from photo current during the period $T_2$. The transistor $T_R$ is in cut-off state under these circumstances so that the diode potential is divided by the opposing capacitors $C_N$ and $C_S$ connected to node M and only charge $Q'_M$ as a function of the potential $V'_2$ is charged.

In other words, $$Q'_M = (V_R - V_L) C_N = V'_2 C_S \quad (4)$$

If the potential at the terminal $\phi'_{BS}$ varies from $V_l$ to $V_C$ at the beginning of the time slot $T_3$, then the instantaneous diode potential $V_3$ at node M has the following relationship pursuant to the rule of initial charge storage:

$$Q'_M = (V_3 - V_C)C_N = V_3 C_S \quad (5)$$

From the formulae (4) and (5), $$V_3 = V_2' + \frac{C_N}{C_N + C_S}(V_C - V_L) \quad (6)$$

No blooming would take place under these circumstances if the potential $V_3$ meets the condition for placing the transistor $T_R$ in cut-off state. This condition during $T_3$ is that the potential $V_3$ be $V_\phi - V_{TC} - \Delta K_{SB}$ higher than the potential $V_\phi$ at $\phi'$.

From formula (6), $$V_2' + \frac{C_N}{C_N + C_S}(V_C - V_L) > V_\phi - V_{TC} - \Delta K_{SB} \quad (7)$$

Because $V_2'$ is equal to the clamp potential $V_L$ when it demonstrates its lowest level in response to photo current, it is possible to suppress the blooming during $T_3$ as long as the $\phi'_{BS}$ voltage levels $V_C$ and $V_L$ meet the following relationship:

$$V_L + \frac{C_N}{C_N + C_S}(V_C - V_L) > V_\phi - V_{TC} - \Delta K_{SB} \quad (8)$$

(V) Time slots $T'_2$, $T'_3$, $T''_2$ and so forth and $T_0$

The same operation as during $T_2$ and $T_3$ is repeated during time slots $T'_2$, $T'_3$, $T''_2$ and so forth.

The imaging device returns again to the read time slot $T_0$, while meeting the condition for suppressing the blooming in this manner. The lowest potential during the time slot $T_0$ (that is, the level where the potential at node M decreases in full extent due to photo current) is the clamp potential $V_L$. Therefore, the amplitude $\Delta V'$ of saturated signals available through this driving technique is as follows:

$$\Delta V = V_2 - V_L \quad (9)$$

While the voltage applied to the photoconductor layer including $\phi'_{BS}$ is pulsatory, the pulse which thereof or the length of $T_3$ falls substantially within a horizontal blanking interval. In this case, $T_3 + T_2 = 63.5$ μsec, $T_2 = 11$ μsec and the averaged value of $\phi_{BS}$ is:

$$\hat{V}_{\phi BS} = V_L + \frac{T_2}{T_3 + T_2} V_C = V_L + 0.17 V_C \quad (10)$$

That is, an averaged bias voltage $\hat{V}_N$ to the photoconductor layer is:

$$\hat{V}_N = V_2 - \hat{V}_{\phi BS} = V_{CH} - V_L - 0.17 V_C \quad (11)$$

Provided that the voltage $\hat{V}_N$ is selected to be $V_{CH}$ higher than the knee point of the photoconductor layer, suppression of the blooming is possible without limiting the dynamic range or causing the burning phenomenon.

To give a further understanding of the advantages described previously, variations in the diode potential at node M in the conventional device as when a DC voltage is applied to the terminal $\phi'_{BS}$ are illustrated in FIG.

5(d) for comparison with that in the present invention as seen in FIG. 5(c).

In the conventional device, the diode potential developing at node M when the pixel read pulse of the level $V_{CH}$ is applied to the terminal $\phi'$ rise only to potential $V_2$ as defined by formula (3).

The amplitude $\Delta V'$ of saturated signals in the conventional device is therefore:

$$\Delta V' = V_2 - V_C \quad (12)$$

Comparison between formulas (9) and (12) indicates that the diode potential at node M envisaged in the present invention is always $V_{BS}$ higher than that in the conventional device in which the DC voltage is applied to the terminal $\phi'_{BS}$.

The present invention, therefore, provdies an extension of the margin corresponding to the potential $V_{BS}$ as compared with the conventional device until the diode potential is reached or the pixel signal components become saturated.

The present invention offers significant advantages in suppression of the blooming phenomenon, prevention of a limited dynamic range and suppression of the burning.

Whereas the solid state imager embodying the present invention includes the photoconductor $D_N$ having photoelectrically conversion performance and the diode $D_S$ forming the source of the pixel read transistor as is clear from the equivalent circuit of FIG. 4, those components shall not be limited thereto. It is possible as an alternative that $D_N$ may be implemented with merely diode material and $D_S$ with photoelectrical conversion material.

Figure 6:
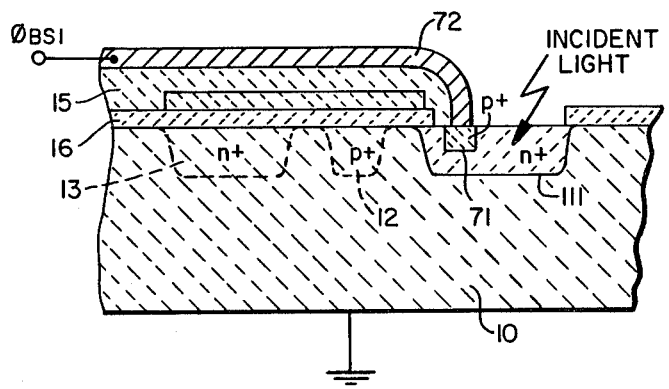
FIG. 6 is a cross sectional view of a principal portion of a solid state imaging apparatus according to another embodiment of the present invention.
Figure 7:
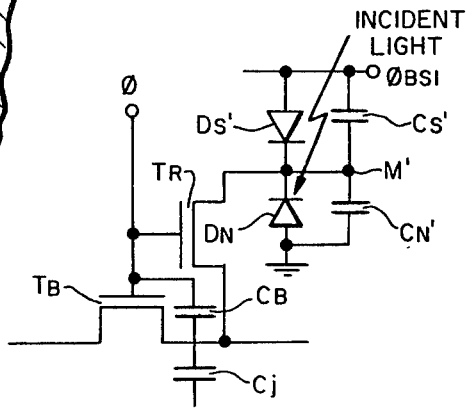
FIG. 7 is an equivalent circuit diagram of the alternative embodiment.

Such an alternative embodiment is illustrated in FIG. 6 showing a single pixel in cross section and FIG. 7 showing an equivalent circuit thereof.

In FIG. 6, an n+ region 111 containing an impurity of a conductivity opposite that of the substrate 10 (p type in this case) is formed which demonstrates photoelectrical conversion performance in cooperation with the substrate 10 when there is incident light. An impurity p+ type region 71 is buried in the impurity n+ type region 111 and electrically connected to an electrode 72.

The p+ region 71 and the impurity n+ region 111 show diode performance.

In FIG. 6, the remaining reference numbers represent components similar to those in FIG. 1.

Figure 5:
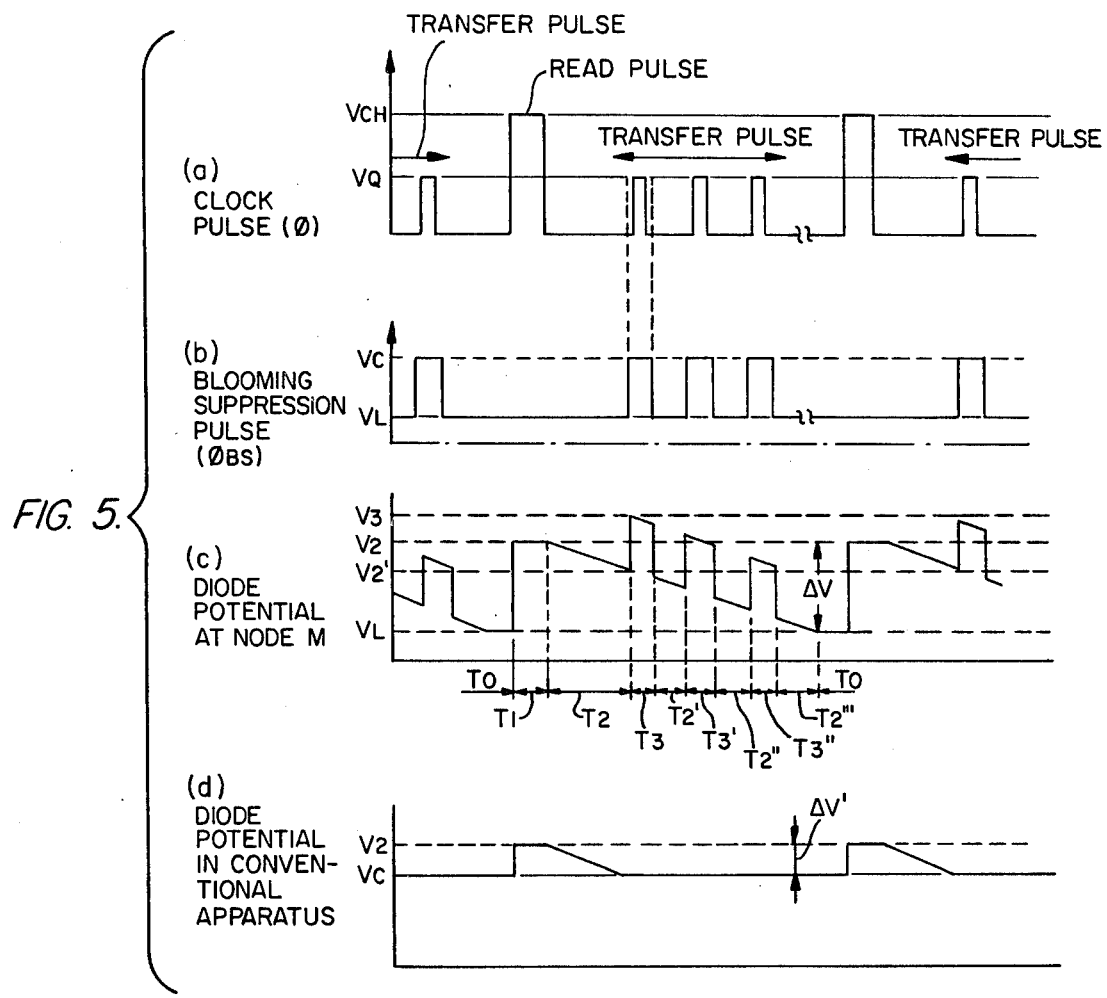
FIG. 5 is a waveform chart for explanation of operation of the apparatus embodying the present invention.

With the solid state image as suggested above, the pulse $\phi_{BS}$ as illustrated in FIG. 5 is applied to a terminal $\phi_{BS1}$ leading from the electrode 72.

In the equivalent circuit diagram of FIG. 7, a diode $D_S'$ is one which is set up by the impurity p+ region 71 and the impurity n+ region 111 and has a capacitance $C_S'$. A photodiode $D_N'$ is one which is set up by the impurity n+ region 111 and the substrate 10 and has a capacitance $C_N'$.

Provided that the pulse voltage $\phi_{BS}$ in FIG. 5 is applied to the electrode $\phi_{BS1}$ of the above constructed solid state imager, the same effect of blooming suppression as described with respect to FIG. 5 is available in this alternative embodiment.

As stated hereinbefore, the present invention not only prevents limiting the dynamic range but also prohibits the occurrence of the blooming due to the excess carriers generated during the period of photo accumulation, by applying the pulses synchronous with the device enabling pulses substantially to the photoconductor layer and clamping the diode potential at the fixed level.

It is also obvious that regions having conductivities opposite to those of the regions disclosed and illustrated above may be employed when the substrate is of an n type semiconductor material.

Of course, the present invention is equally applicable to single-dimensional and two-dimensional solid state images.

What is claimed is:

1. A solid state imaging apparatus having a plurality of cells for accumulating charge signals in response to an intensity of an incident light from an object; charge transfer means connected to said cells through a switching element; and driving means for applying a read pulse and a transfer pulse to said switching element and said transfer means, respectively, to read the charge signals from said cells and transfer those signals, thereby producing a video signal, in which a blooming suppression means is provided for supplying a blooming suppression pulse synchronous with said transfer pulse to a node between said cell and said switching element through a capacitive coupling.

2. A solid state imaging apparatus as claimed in claim 1, wherein the width of said blooming suppression pulse is selected to be greater than the width of said transfer pulse.

* * * * *